US009927468B2

United States Patent
Tawaragi

(10) Patent No.: US 9,927,468 B2
(45) Date of Patent: *Mar. 27, 2018

(54) POWER THEFT INSPECTION APPARATUS AND METHOD, AND RECORDING MEDIUM

(71) Applicant: PIONEER CORPORATION, Kanagawa (JP)

(72) Inventor: Yuji Tawaragi, Kanagawa (JP)

(73) Assignee: PIONEER CORPORATION, Kanagawa (JP)

( * ) Notice: Subject to any disclaimer, the term of this patent is extended or adjusted under 35 U.S.C. 154(b) by 530 days.

This patent is subject to a terminal disclaimer.

(21) Appl. No.: 14/593,160

(22) Filed: Jan. 9, 2015

(65) Prior Publication Data

US 2015/0115734 A1    Apr. 30, 2015

Related U.S. Application Data

(63) Continuation-in-part of application No. PCT/JP2012/067737, filed on Jul. 11, 2012.

(51) Int. Cl.
*H01F 27/42* (2006.01)
*H01F 38/00* (2006.01)
(Continued)

(52) U.S. Cl.
CPC ............. *G01R 21/00* (2013.01); *H02J 5/005* (2013.01); *H02J 17/00* (2013.01); *H02J 50/12* (2016.02); *G01R 22/066* (2013.01)

(58) Field of Classification Search
CPC ........ H02J 17/00; H02J 5/005; G01R 22/066; G01R 21/00

See application file for complete search history.

(56) References Cited

U.S. PATENT DOCUMENTS 6,272,327 B1 * 8/2001 Kurchuk .................. H04B 1/48 455/217
8,412,286 B2 * 4/2013 Lin .................... H04W 52/0274 375/258

(Continued)

FOREIGN PATENT DOCUMENTS

JP    2009-261105    11/2009
JP    2010-051137    3/2010
(Continued)

OTHER PUBLICATIONS

International Search Report PCT/JP2012/067737 dated Sep. 11, 2012.

*Primary Examiner* — Jared Fureman
*Assistant Examiner* — Esayas Yeshaw
(74) *Attorney, Agent, or Firm* — Young & Thompson

(57) ABSTRACT

A power theft inspection apparatus is provided with: a controlling device configured to open a third switch unit between a power reception unit and a power reception control circuit of a power receiving apparatus at the start of a power theft inspection, then open a first switch unit between a power transmission unit and a power supply unit of a power transmitting apparatus after the opening of the third switch unit, and then close a second switch unit configured to short-circuit the power transmission unit of the power transmitting apparatus after the opening of the first switch unit; and a determining device configured to determine whether or not there is power theft according to a current detected by a first current detecting device configured to detect a current in the power transmission unit of the power transmitting apparatus upon the power theft inspection.

9 Claims, 6 Drawing Sheets

(51) Int. Cl.
*H01F 37/00* (2006.01)
*G01R 21/00* (2006.01)
*H02J 50/12* (2016.01)
*H02J 17/00* (2006.01)
*H02J 5/00* (2016.01)
G01R 22/06 (2006.01)

(56) References Cited

U.S. PATENT DOCUMENTS

| | | | |
|---|---|---|---|
| 8,803,365 B2 * | 8/2014 | Lee | H02J 5/005 |
| | | | 307/104 |
| 9,006,935 B2 * | 4/2015 | Fukushima | H02J 5/005 |
| | | | 307/104 |
| 9,444,247 B2 * | 9/2016 | Kim | H02H 7/1252 |
| 2011/0068819 A1 * | 3/2011 | Sims | G01R 31/40 |
| | | | 324/764.01 |
| 2011/0121658 A1 | 5/2011 | Fukada | |
| 2011/0285211 A1 * | 11/2011 | Endo | H02J 17/00 |
| | | | 307/104 |
| 2013/0154382 A1 * | 6/2013 | Kurata | H02J 17/00 |
| | | | 307/104 |
| 2013/0260676 A1 * | 10/2013 | Singh | H04B 5/0037 |
| | | | 455/41.1 |

FOREIGN PATENT DOCUMENTS

| | | |
|---|---|---|
| JP | 4665991 | 4/2011 |
| JP | 2012-065477 | 3/2012 |

* cited by examiner

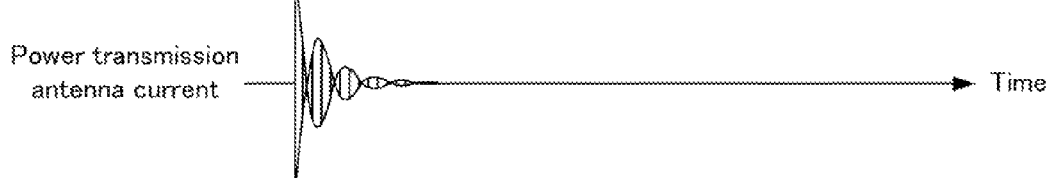
FIG. 4A
Power transmission antenna current → Time
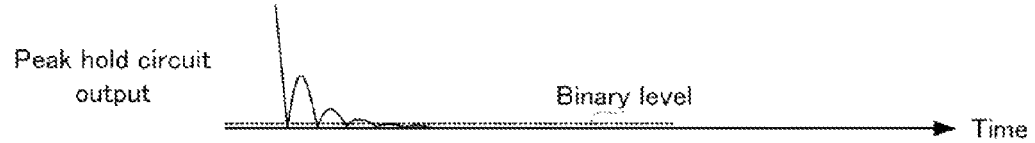
FIG. 4B
Peak hold circuit output — Binary level → Time
FIG. 4C
Binary circuit output → Time
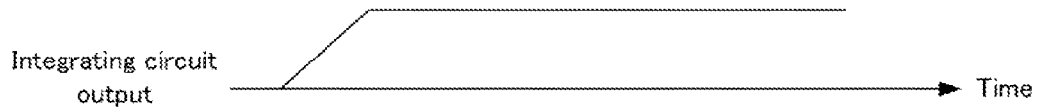
FIG. 4D
Integrating circuit output → Time
FIG. 5
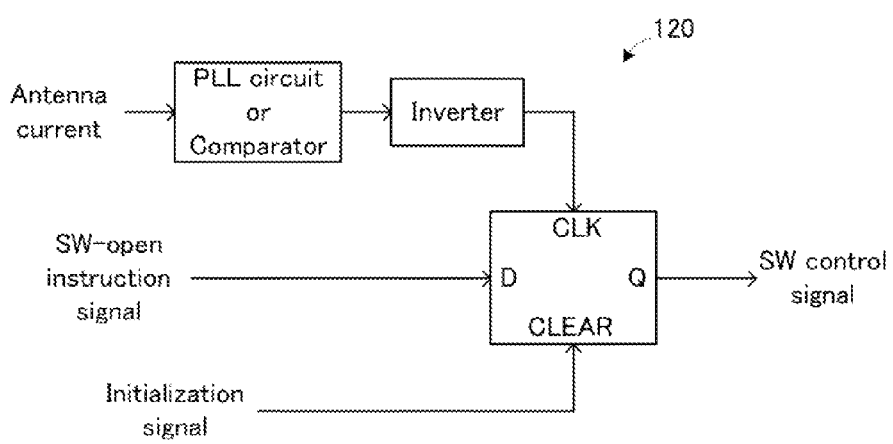

POWER THEFT INSPECTION APPARATUS AND METHOD, AND RECORDING MEDIUM

CROSS REFERENCES TO RELATED APPLICATION

This application is a continuation-in-part of international application PCT/JP2012/067737 filed on Jul. 11, 2012, the entire disclosure of which is incorporated herein by reference in its entirety.

BACKGROUND OF THE INVENTION

1. Field of the Invention

The present invention relates to a power theft inspection apparatus and method which detects the presence or absence of power theft in a power transmission system in which electric power can be transmitted and received in a wireless manner, and a recording medium.

2. Description of the Related Art

As this type of apparatus, for example, there is proposed such an apparatus that is provided with a detection unit which is provided with a coil and which detects an oscillating magnetic field formed around a power transmission unit, and that is configured to determine whether or not there is power theft on the basis of the state of the oscillating magnetic field detected by the detection unit (refer to Japanese Patent No. 4665991).

In the technology described in the Japanese Patent No. 4665991, however, there is a possibility that the oscillating magnetic field changes due to the power theft, but it is also likely hard to set a criterion, which is technically problematic.

SUMMARY OF THE INVENTION

In view of the aforementioned problem, it is therefore an object of the present invention to provide a power theft inspection apparatus and method, and a recording medium which allows relatively easy detection of the presence or absence of the power theft.

The present invention, however, aims at an apparatus which uses magnetic resonance by high-Q LCR resonant circuits for power transmission and reception. It is considered that high efficiency is desirably to be obtained upon power theft. Thus, in the present invention, a power theft apparatus is assumedly an apparatus configured to perform the power theft in the magnetic resonance by the LCR resonant circuit.

The above object of the present invention can be solved by a power theft inspection apparatus configured to detect presence or absence of power theft for a power transmitting apparatus is provided with: a power transmission unit having two terminals; a power supply unit configured to supply alternating current (AC) power to the power transmission unit; a first switch unit disposed between one of the two terminals and the power supply unit; a second switch unit which allows a short-circuit between the two terminals; and a first current detecting device configured to detect a current flowing through the power transmission unit, said power theft inspection apparatus comprising: a controlling device configured to control the first switch unit such that the first switch unit is opened and then control the second switch unit such that the second switch unit is closed; and a determining device configured to determine whether or not there is the power theft according to the current detected by the first current detecting device.

The above object of the present invention can be solved by a power theft inspection method performed by a power theft inspection apparatus configured to detect presence or absence of power theft for a power transmitting apparatus is provided with: a power transmission unit having two terminals; a power supply unit configured to supply alternating current (AC) power to the power transmission unit; a first switch unit disposed between one of the two terminals and the power supply unit; a second switch unit which allows a short-circuit between the two terminals; and a first current detecting device configured to detect a current flowing through the power transmission unit, said power theft inspection method is provided with: a first process of controlling the first switch unit such that the first switch unit is opened; a second process of controlling the second switch unit such that the second switch unit is closed after the first process; and a third process of determining whether or not there is the power theft according to the current detected by the first current detecting device after the second process.

The above object of the present invention can be solved by a non-transitory tangible recording medium configured to store therein a computer program which makes a computer mounted on a power theft inspection apparatus function as a controlling device and a determining device, said power theft inspection apparatus being configured to detect presence or absence of power theft for a power transmitting apparatus is provided with a power transmission unit having two terminals; a power supply unit configured to supply alternating current (AC) power to the power transmission unit; a first switch unit disposed between one of the two terminals and the power supply unit; a second switch unit which allows a short-circuit between the two terminals; and a first current detecting device configured to detect a current flowing through the power transmission unit, said power theft inspection apparatus is provided with: the controlling device configured to control the first switch unit such that the first switch unit is opened and then control the second switch unit such that the second switch unit is closed; and the determining device configured to determine whether or not there is the power theft according to the current detected by the first current detecting device.

The operation and other advantages of the present invention will become more apparent from embodiments and examples explained below.

BRIEF DESCRIPTION OF THE DRAWINGS

FIG. 4A to FIG. 4D are diagrams illustrating one example of a time variation between the current flowing through the power transmission antenna and output of an integrating circuit according to the current;

FIG. 5 is a block diagram illustrating a switch control circuit in the power theft detection unit in the example;

DETAILED DESCRIPTION OF THE PREFERRED EMBODIMENTS

Figure 1:
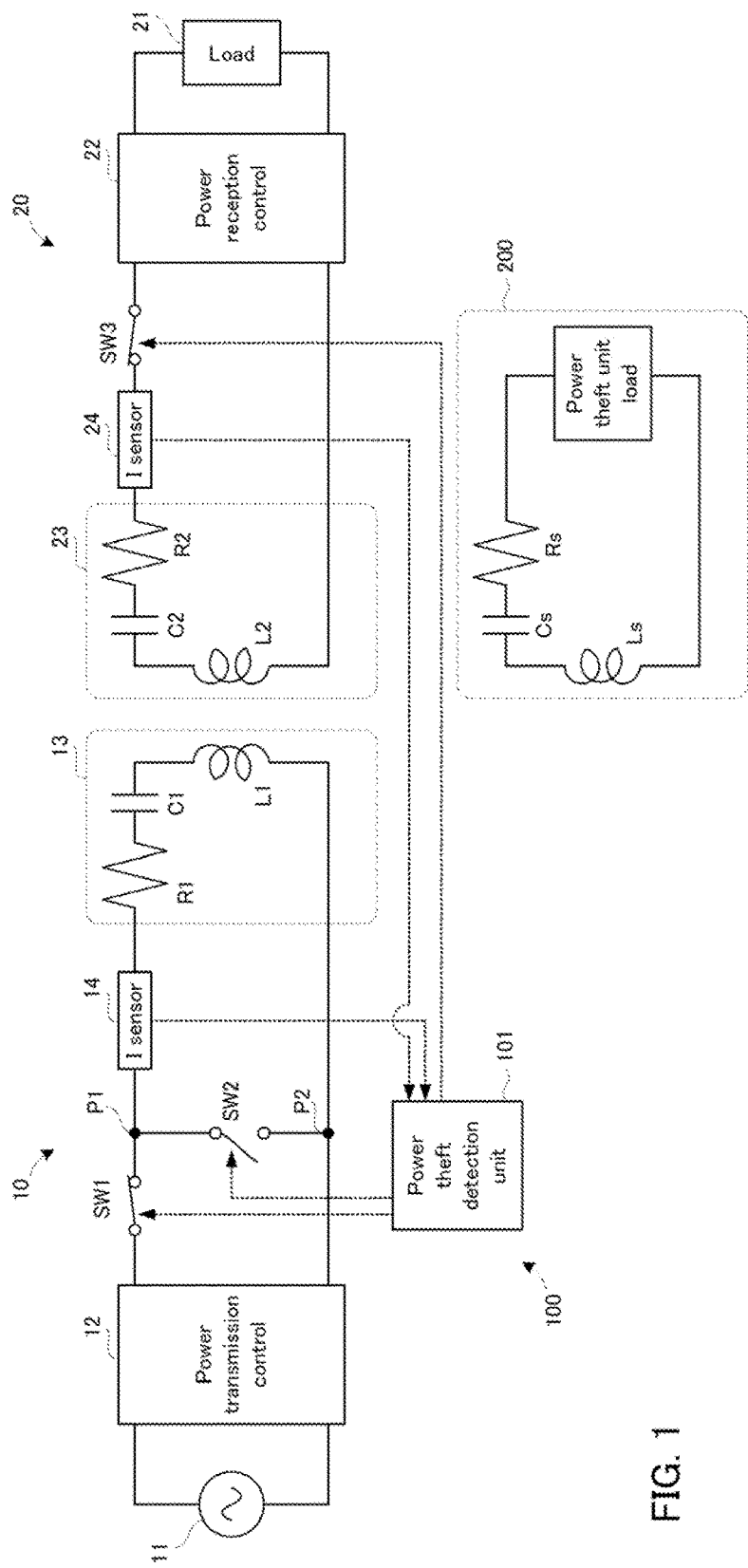
FIG. 1 is a conceptual diagram illustrating is schematic configuration of a wireless power transmission system in an example.

Embodiments of the power theft inspection apparatus and the like of the present invention will be explained.
(Embodiment of Power Theft Inspection Apparatus)

A power theft inspection apparatus in an embodiment is a power theft inspection apparatus configured to detect presence or absence of power theft for a power transmitting apparatus is provided with: a power transmission unit having two terminals; a power supply unit configured to supply alternating current (AC) power to the power transmission unit; a first switch unit disposed between one of the two terminals and the power supply unit; a second switch unit which allows a short-circuit between the two terminals; and a first current detecting device configured to detect a current flowing through the power transmission unit, said power theft inspection apparatus comprising: a controlling device configured to control the first switch unit such that the first switch unit is opened and then control the second switch unit such that the second switch unit is closed; and a determining device configured to determine whether or not there is the power theft according to the current detected by the first current detecting device.

The power transmitting apparatus constitutes a part of a power transmission system provided with the power transmitting apparatus and a power receiving apparatus. The power transmitting apparatus and the power receiving apparatus transmit and receive electric power in a wireless manner by magnetic resonance by high-Q LCR resonant circuits.

The power transmitting apparatus is provided with: the power transmission unit having the two terminals; the power supply unit configured to supply the AC power to the power transmission unit; the first switch unit disposed between one of the two terminals and the power supply unit; the second switch unit which allows the short-circuit between the two terminals; and the first current detecting device configured to detect the current flowing through the power transmission unit.

The power theft inspection apparatus is provided with the controlling device configured to control each of the first switch unit and the second switch unit of the power transmitting apparatus and the determining device configured to determine whether or not there is the power theft according to the current detected by the first current detecting device of the power transmitting apparatus upon power theft inspection.

The controlling device firstly controls the first switch unit such that the first switch unit of the power transmitting apparatus is opened at the start of the power theft inspection. As a result, the power supply from the power supply unit to the power transmission unit is stopped. The controlling device then controls the second switch unit such that the second switch unit is closed (i.e. such that the two terminals of the power transmitting apparatus are short-circuited).

Here, the power transmission unit has an inductor element, a capacitor element and an electrical resistance. Thus, due to the short-circuit of the two terminals of the power transmission unit by the second switch unit, the power transmission unit and the second switch unit form high-Q LCR resonant circuits. Then, an oscillating current in the power transmission unit gradually decays.

The following matters hold in the power transmission using the magnetic resonance by high-Q LCR resonant circuits. If there is only the power transmission unit, if there is no power receiving apparatus, and if there is no power theft, energy stored in the power transmission unit is consumed only by the power transmission unit. Therefore, the oscillating current in the power transmission unit simply decays, exponentially, according to a Quality factor and a resonant frequency of the power transmission unit. On the other hand, if there is the power theft, the energy stored in the power transmission unit is consumed excessively by the apparatus which performs the power theft. Thus, the oscillating current in the power transmission unit decays more quickly than that in the absence of the power theft, and a decay envelope also changes differently.

Since the Quality factor and the resonant frequency of the power transmission unit are determined upon designing, there is known a change in (or a time constant of) the current detected upon the power theft inspection in the absence of the power theft. It is therefore possible to determine whether or not there is the power theft, with reference to the change in the current detected by the first current detecting device.

Thus, in the embodiment, it is determined by the determining device which is provided, for example, with a memory, a processor, a comparator and the like, whether or not there is the power theft according to the current detected by the first current detecting device. As a result, it is possible to relatively easily detect the presence or absence of the power theft. In particular, as opposed to the technology described in the Japanese Patent No. 4665991 described above, it is unnecessary to provide a coil for detecting the power theft, separately from the power transmission unit. It is thus possible to prevent, for example, an increase in manufacturing cost the like.

In one aspect of the power theft inspection apparatus in the embodiment, said controlling device controls a third switch, which is disposed between a power reception control circuit and a power reception unit of a power receiving apparatus configured to receive electric power transmitted from the power transmitting apparatus, such that the third switch unit is opened, before controlling the first switch unit such that the first switch unit is opened.

This aspect is geared toward a case where there is a power receiving apparatus. According to this aspect, the power receiving apparatus is provided with a power reception unit, a power reception control circuit, and a third switch unit, disposed between the power reception unit and the power reception control circuit. The power reception unit is opened by opening the third switch. This is a feature for creating situation where there is no the power reception unit, substantively.

In this aspect, the power receiving apparatus further comprises a second current detecting device configured to detect a current flowing between the power reception unit and the power reception control circuit, and said controlling device controls the third switch unit such that the third switch unit is opened at a timing at which the current detected by the second current detecting device can be considered to be zero, or controls the first switch unit such that the first switch unit is opened at a timing at which the current detected by the first current detecting device can be considered to be zero.

By virtue of such construction, it is possible to prevent, that excessive voltage is applied to the power transmitting apparatus or the power receiving apparatus upon opening each of the first switch and the third switch, which is extremely useful practice.

In another aspect of the power theft inspection apparatus in the embodiment, said controlling device controls the first switch unit such that the first switch unit is opened at a timing at which the current detected by the first current detecting device can be considered to be zero.

According to this aspect, it is possible to prevent that excessive voltage is applied to the power transmitting apparatus, which is extremely useful in practice.

In another aspect of the power theft inspection apparatus in the embodiment, said controlling device controls the second switch unit such that the second switch unit is opened at an end of a power theft inspection, then controls the third switch unit such that the third switch unit is closed, and then controls the first switch such that the first switch unit is closed.

According to this aspect, it is possible to appropriately restart the power transmission between the power transmission unit of the power transmitting apparatus and the power reception unit of the power receiving apparatus, after the power theft inspection.

In another aspect of the power theft inspection apparatus in the embodiment, said determining device determines whether or not there is the power theft on the basis of a time constant of decay associated with the current detected by the first current detecting device in a predetermined period after the closing of the second switch unit.

According to this aspect, it is possible to easily determine whether there is the power theft. This is because the time constant of the current decay in the absence of the power theft can be accurately predicted (i.e. is known) from the Quality factor and the resonant frequency of the power transmission unit which are determined upon designing.

In another aspect of the power theft inspection apparatus it the embodiment, said controlling device controls the power supply unit to reduce the AC power supplied to the power transmission unit before controlling the first switch unit such that the first switch unit is opened.

According to this aspect, it is possible to prevent that a large current flows through the power transmission unit if the first switch unit is closed, which is extremely useful in practice.

In another aspect of the power theft inspection apparatus in the embodiment, the power receiving apparatus comprises a switch controlling circuit configured to control the third switch unit by inputting a signal indicating current detected by the second current detecting device and a switch-open instruction signal created by the controlling device, and said controlling device controls the third switch unit through the switch controlling circuit.

According to this aspect, the controlling device controls the third switch unit through the switch controlling circuit by outputting the switch-open instruction signal. The switch controlling circuit controls the third switch unit such that the third switch unit is opened at a timing at which the current detected by the second current detecting device can be considered to be zero. Therefore, according to this aspect, it is possible to prevent that excessive voltage is applied to the power receiving apparatus upon opening the third switch unit, which is extremely useful in practice.

(Embodiment of Power Theft Inspection Method)

A power theft inspection method in an embodiment is a power theft inspection method performed by a power theft inspection apparatus configured to detect presence or absence of power theft for a power transmitting apparatus is provided with: a power transmission unit having two terminals; a power supply unit configured to supply alternating current (AC) power to the power transmission unit; a first switch unit disposed between one of the two terminals and the power supply unit; a second switch unit which allows a short-circuit between the two terminals; and a first current detecting device configured to detect a current flowing through the power transmission unit, said power theft inspection method is provided with: a first process of controlling the first switch unit such that: the first switch unit is opened; a second process of controlling the second switch unit such that the second switch unit is closed after the first process; and a third process of determining whether or not there is the power theft according to the current detected by the first current detecting device after the second process.

According to the power theft inspection method in the embodiment, as in the power theft inspection apparatus in the embodiment described above, it is possible to relatively easily detect the presence or absence of the power theft.

Even the power theft inspection method in the embodiment can adopt the same various aspects as those of the power theft inspection apparatus in embodiment described above.

(Embodiment of Recording Medium)

A recording medium in an embodiment is a non-transitory tangible recording medium configured to store therein a computer program which makes a computer mounted on a power theft inspection apparatus function, as a controlling device and a determining device, said power theft inspection apparatus being configured to detect presence or absence of power theft for a power transmitting apparatus is provided with a power transmission unit having two terminals; a power supply unit configured to supply alternating current (AC) power to the power transmission unit; a first switch unit disposed between one of the two terminals and the power supply unit; a second switch unit which allows a short-circuit between the two terminals; and a first current detecting device configured to detect a current flowing through the power transmission unit, said power theft inspection apparatus is provided with the controlling device configured to control the first switch unit such that the first switch unit is opened and then control the second switch unit such that the second switch unit is closed; and the determining device configured to determine whether or not there is the power theft according to the current detected by the first current detecting device.

According to the recording medium in the embodiment, the power theft inspection apparatus in the embodiment described above can be relatively easily realized as the computer reads and executes the computer program stored in a random access memory (ROM), a compact disc read only memory (CD-ROM), to DVD read only memory (DVD-ROM), and the like which are the recording medium. This makes it possible to relatively easily detect the presence or absence of the power theft, as in the power theft inspection apparatus in the embodiment described above.

Examples

Hereinafter, examples of the power theft inspection apparatus of the present invention will be explained with reference to the drawings.

A wireless power transmission system in an example will be explained with reference to FIG. 1. FIG. 1 is a conceptual diagram illustrating a schematic configuration of the wireless power transmission system in the example.

In FIG. 1, the wireless power transmission system is provided with a power transmitting apparatus 10 and a power receiving apparatus 20. In the wireless power transmission system, electric power is transmitted and received in a wireless manner between the power transmitting apparatus 10 and the power receiving apparatus 20, by magnetic resonance by high-Q LCR resonant circuits.

The power transmitting apparatus 10 is provided with an alternating current (AC) power supply 11, a power transmission control unit 12, a power transmission antenna 13 and a current detector 14. The power transmission antenna 13 is a series resonant circuit having a coil with inductance L1, a capacitor with capacitance C1, and a resistor with resistance R.

In FIG. 1, the power transmission antenna 13 uses equivalent circuit representation. Even an actual power transmission antenna which does not have either C1 or R1 as an entity (e.g. in which the capacitance C1 is parasitic capacitance) is included in the power transmission antenna 13 in the example. Moreover, the frequency characteristics of the power transmission antenna 13 corresponding to an actual frequency used may not strictly match but may be approximately equivalent to the equivalent, circuit illustrated in FIG. 1.

The power transmitting apparatus 10 is further provided with a switch SW1 disposed between a terminal P1 of the power transmission antenna 13 and the power transmission control unit 12, and a switch SW2 which allows a short-circuit between the terminal P1 and a terminal P2 of the power transmission antenna 13. When electric power is supplied from the power transmitting apparatus 10 to the power receiving apparatus 20, the switch SW1 is closed turned ON), and the switch SW2 is opened (i.e. turned OFF).

The power receiving apparatus 20 is provided with a load 21 such as, for example, a battery, a power reception control unit 22, a power reception antenna 23 and a current detector 24. The power reception antenna 23 is a series resonant circuit having a coil with inductance L2, a capacitor with capacitance C2, and a resistor with resistance R2.

In FIG. 1, the power reception antenna 23 also uses the equivalent, circuit representation, as in the power transmission antenna 13. Even a power reception antenna which does not have either C1 or R1 as an entity is also included in the power reception antenna 23 in the example. Moreover, the frequency characteristics of the power reception antenna 23 corresponding to an actual frequency used may not strictly match but may be approximately equivalent to the equivalent, circuit illustrated in FIG. 1.

The power receiving apparatus 20 is further provided with a switch SW3 disposed between the power reception antenna 23 and the power reception control unit 22. When electric power is supplied from the power transmitting apparatus 10 to the power receiving apparatus 20, the switch SW3 is closed (i.e. turned ON).

Although the illustration of a detailed configuration of a power theft apparatus 200 is omitted, the power theft apparatus 200 has the same configuration as that of the power receiving apparatus 20. The main constituents of the power theft apparatus 200 are a power theft load and a power theft antenna. In FIG. 1, the power theft antenna is illustrated as an equivalent circuit having it coil with inductance Ls, a capacitor with capacitance Cs, and a resistor with resistance Rs.

In the example, the circuit configuration of each of the power transmission antenna 13, the power reception antenna 23, and the power theft antenna is equivalent to high-Q LCR resonant circuits which allows series resonance at a common resonant frequency.

(Power Theft Inspection)

A power theft inspection apparatus 100 is provided with a power theft detection unit 101. The power theft inspection apparatus 100 (or the power theft detection unit 101) may be mounted on the power transmitting apparatus 10, or may be mounted on the power receiving apparatus 20, or may be an apparatus separated from the power transmitting apparatus 10 and the power receiving apparatus 20.

Moreover, a part of the function of the power theft inspection apparatus 100 (or the power theft detection unit 101) may be mounted on the power transmitting apparatus 10, and another part of the function of the power theft inspection apparatus 100 may be mounted on the power receiving apparatus 20. In this case, the part of the power theft inspection apparatus 100 mounted on the power transmitting apparatus 10 transmits an ON/OFF control signal of the switch SW3 to the other part of the power theft inspection apparatus 100 mounted on the power receiving apparatus 20. On the other hand, the other part of the power theft inspection apparatus 100 mounted on the power receiving apparatus 20 transmits ON/OFF information about the switch SW3 to the part of the power theft inspection apparatus 100 mounted on the power transmitting apparatus 10.

When starting a power theft inspection, the power theft detection unit 101 firstly transmits to the power receiving apparatus 20 a signal for requiring the opening of the switch SW3. After the reception of the signal indicating the opening of the switch SW3 (i.e. after the opening of the switch SW3), the power theft detection unit 101 transmits to the power transmitting apparatus 10 a signal for requiring the opening of the switch SW1. After the reception of the signal indicating the opening of the switch SW1 (i.e. after the opening of the switch SW1), the power theft detection unit 101 transmits to the power transmitting apparatus 10 a signal for requiring the closing of the switch SW2.

As a result, the switches SW1 and SW3 are opened, and the switch SW2 is closed. Here, in particular, the power theft detection unit 101 transmits to the power transmitting apparatus 10 a signal for requiring a reduction in AC power which is supplied to the power transmission antenna 13, before transmitting the signal for requiring the opening of the switch SW1. This makes it possible to prevent that a large current flows through the power transmission antenna 13 after the power transmission antenna 13 is short-circuited by the switch SW2.

If the switch SW3 of the power receiving apparatus 20 is opened (i.e. turned OFF), the power reception antenna 23 is opened, and a current in the power reception antenna 23 becomes zero. The open state of the switch SW3 of the power receiving apparatus 20 is the same as a state in which the power reception antenna 23 is removed, for the power transmitting apparatus 10. In addition, due to the opening of the switch SW1 of the power transmitting apparatus 10 and the closing of the switch SW2, a current in the power transmission antenna 13 is decayed with time by the resistance R1 or the like.

The power theft detection unit 101 uses the phenomenon of the decay with time of the current in the power transmission antenna 13 to determine whether or not there is power theft according to a current detected by a current detector 14. If it is determined that there is the power theft, for example, the power theft detection unit 101 may sound an alarm or control the power transmitting apparatus 10 to stop the power transmission.

On the other hand, if it is determined that there is no power theft, the power theft detection unit 101 firstly transmits to the power transmitting apparatus it) a signal for requiring the opening of the switch SW2. After the reception of the signal indicating the opening of the switch SW2 (i.e. after the opening of the switch SW2), the power theft detection unit 101 transmits to the power receiving apparatus 20 a signal for requiring the closing of the switch SW3. After the reception of the signal indicating the closing of the switch SW3 (i.e., after the closing of the switch SW3), the power theft detection unit 101 transmits to the power transmitting apparatus 10 a signal for requiring the closing of the switch SW1.

As a result, the switches SW1 and SW3 are closed, and the switch SW2 is opened. After the closing of the switch SW1, predetermined electric power is supplied to the power transmission antenna 13, by which the power supply from the power transmitting apparatus 10 to the power receiving apparatus 20 is restarted.

(Power Theft Determination Process)

Next, a power theft determination process performed by the power theft detection unit 101 as configured above will be explained, with reference to FIG. 2 to FIG. 4.

Figure 2A:
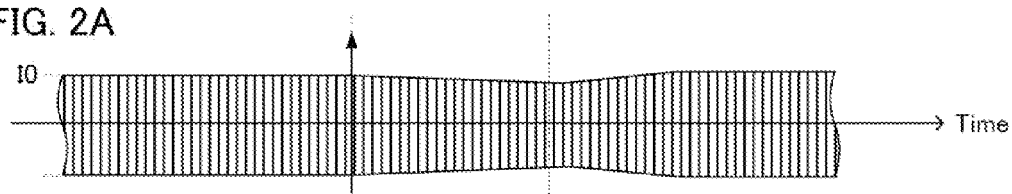
FIG. 2A is a diagram illustrating one example of a time variation of a current flowing through a power transmission antenna if there is no power theft and FIG. 2B is a diagram illustrating one example of a time variation of the current flowing through the power transmission antenna if there is power theft.
Figure 2B:
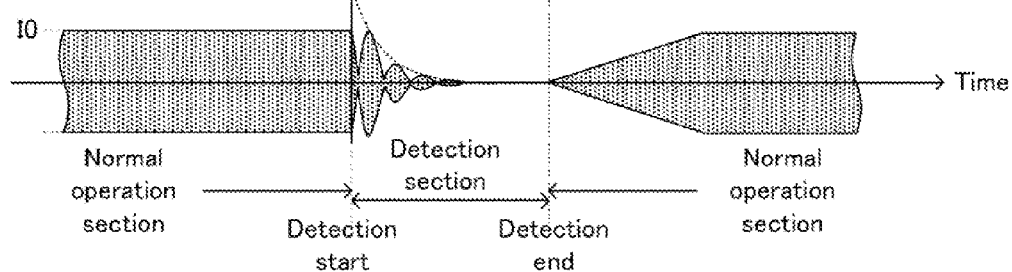

Firstly, a change in the current flowing through the power transmission antenna 13 will be theoretically explained with reference to FIG. 2A and FIG. 2B. FIG. 2A is a diagram illustrating one example of a time variation of the current flowing through the power transmission antenna 13 if there is no power theft and FIG. 2B is a diagram illustrating one example of a time variation of the current flowing through the power transmission antenna 13 if there is the power theft. The explanation below applies in the case of a power transmission system which uses the magnetic resonance by high-Q LCR resonant circuits and in which the resonant frequency of each of the power transmission antenna 13, the power reception antenna 23, and the power theft antenna has a common value ω0.

Upon power theft inspection, electrically speaking, the power reception antenna 23 is removed. Thus, if there is no power theft, energy stored in the power transmission antenna 13 is consumed only by the resistance R1 in the power transmission antenna 13. According to theoretical calculation, a time change I_org(t) of an oscillating current in the power transmission antenna 13 is as follows.

$$\text{I\_org}(t) = I0 \cdot \exp\left(-\frac{t}{\tau 0}\right) \cdot \cos(\omega_0 t), \tau 0 = \frac{2Q}{\omega_0} \quad (1)$$

wherein, I0 is a peak value of the oscillating current in the power transmission antenna 13 at a start time point of the power theft inspection, ω0 is the resonant frequency of the power transmission antenna 13, Q is Quality factor of the power transmission antenna 13 (which is equal to ω0*L1/R1), and τ0 is a time constant determined by the equation (1). The initial phase term of the resonant frequency component is not clearly indicated.

In other words, the oscillating current in the power transmission antenna 13 simply decays, exponentially, according to the Quality factor and the resonant frequency ω0 of the power transmission antenna 13. Equation (1) is illustrated in FIG. 2A.

If there is the power theft, the energy stored in the pew transmission antenna is consumer excessively by the apparatus which performs the power theft (i.e. the power the apparatus 200). On the premise the power theft antenna has the same resonant frequency ω0 as that power transmission antenna 13, a time change I_steal(t) of the oscillating current in the power transmission antenna 13 is as follows, according to theoretical calculation.

$$\text{I\_steal}(t) = I1 \cdot \exp\left(-\frac{t}{\tau 1}\right) \cdot \cos(\omega_0 t) \cdot \cos\left(\frac{k\omega_0}{2}t + \phi\right) \quad (2)$$

wherein, I1 is a peak value of the oscillating current in the power transmission antenna 13 at the start time point, of the power theft inspection, ω0 is the resonant frequency of each of the power transmission antenna 13 and the power theft antenna, k is a coupling coefficient between the power transmission antenna 13 and the power theft antenna, Φ is a initial phase determined in a state at the start time point of the power theft inspection, and τ1 is a time constant determined by the state of the power transmission antenna and the power theft antenna. The initial phase term of the resonant frequency component is not clearly indicated. Equation (2) is illustrated in FIG. 2B.

If a comparison is made between the time constants τ0 and τ1 of the current decay in the Equations (1) and (2) described above, τ0>τ1 holds. In other words, the oscillating current in the power transmission antenna 13 in the presence of the power theft decays more quickly than that in the absence of the power theft, and a decay envelope also changes differently.

As is clear from FIG. 2A and FIG. 2B (or the Equations (1) and (2)), the change in the oscillating current in the power transmission antenna 13 in a power theft inspection section (refer to FIG. 2A and FIG. 2B) differs depending on the presence or absence of the power theft.

The present inventor has focused on the fact that the presence or absence of the power theft can be easily determined due to the decay of the current in the power transmission antenna 13, and has incorporated a determination circuit configured to measure the time constant of the current decay (hereinafter referred to as the time constant) τ0 or τ1 into the power theft detection unit 101.

Next, the determination circuit incorporated into the power theft detection unit 101 will be explained with reference to FIG. 3 and FIG. 4. FIG. 3 is a block diagram illustrating the determination circuit in the power theft detection unit 101 in the example. FIG. 4A to FIG. 4D are diagrams illustrating one example of a time variation between the current flowing through the power transmission antenna and output of an integrating circuit according to the current.

Figure 3:
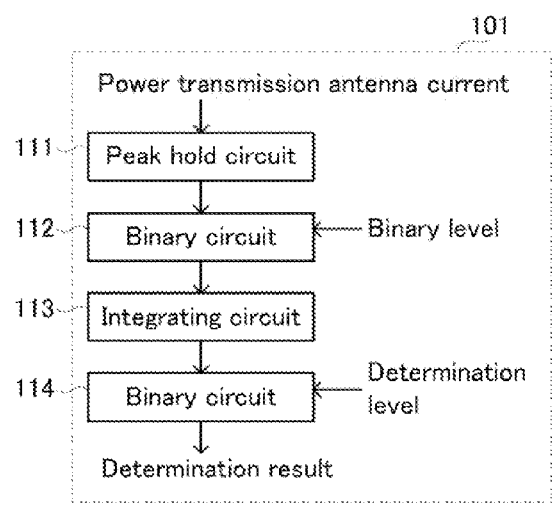
FIG. 3 is a block diagram illustrating a determination circuit in a power theft detection unit in the example.

In FIG. 3, in order to easily measure the time constant, the determination circuit in the example is provided with a peak hold circuit 111, a binarization circuit 112, an integrating circuit 113, and a binarization circuit 114.

With reference to FIG. 4A to FIG. 4D, the operation of the determination circuit will be explained. This is omitted in FIG. 4A to FIG. 4D, but the integrating circuit 113 of the determination circuit is reset at the start of a detection section. The resetting is performed, for example, by discharging a capacitor if the integrating circuit is configured by using the capacitor.

The peak hold circuit 111 outputs a signal indicating voltage corresponding to the envelope in a case where the current has a positive value as illustrated in FIG. 4B, on the basis of a signal indicating the current detected by the current detector 14 (refer to FIG. 4A).

Then, the binarization circuit 112 binarizes the signal outputted from the peak hold circuit 111, according to a predetermined binarize level. The predetermined binarize level is set, for example, at approximately ⅕ to 1/10 of a current value at the start of the detection section.

If there is the power theft, the current in the power transmission antenna 13 relatively rapidly decays, and thus, as illustrated in FIG. 4C, the output of the binarization circuit 112 becomes "zero" at a relatively early stage. In other words, the output is "zero" in most of the detection section (refer to FIG. 2A and FIG. 2B). On the other hand, if there is no power theft, the current in the power transmission antenna 13 relatively gradually decays, and thus, the output of the binarization circuit 112 is "1" in most of the detection section (refer to FIG. 2A and FIG. 2B).

The integrating circuit 113 integrates the output of the binarization circuit 112, and there is thus a large difference in the output of the integrating circuit 113 in the detection section (refer to FIG. 4D) between the presence of the power theft and the absence of the power theft.

Thus, if the output of the integrating circuit 113 is inputted to the binarization circuit 114 in which an appropriate determination level is set, "1" is not outputted from the binarization circuit 114 at an end time point of the detection section in the presence of the power theft. On the other hand, if there is no power theft, "1" is outputted from the binarization circuit 114 at the end Lime point of the detection section.

Therefore, the power theft detection unit 101 determines that there is the power theft, in the condition that "1" is not outputted from the binarization circuit 114 at the end time point of the detection section. On the other hand, the power theft detection unit 101 determines that there is no power theft, in the condition that "1" is outputted from the binarization circuit 114 at any time point of the detection section.

As described above, the determination circuit in the example generates the output of the integrating circuit 113 in which the time constant of the current in the detection section is reflected, and it is thus possible to measure the time constant of the current on an extremely simple circuit.

Here, the determination level of the binarization circuit 114 will be additionally explained. The time constant of the current in the power transmission antenna 13 in the absence of the power theft can be accurately predicted from the Quality factor and the resonant frequency ω0 of the power transmission antenna 13 which are determined upon designing. In other words, the output value of the integrating circuit 113 in the absence of the power theft can be easily predicted. Therefore, in order to determine whether or not there is the power theft, the determination level may be set to have a value smaller than the output value of the integrating circuit 113 in the absence of the power theft.

The determination circuit in the example is one example of what can be easily realized, and can be also realized in another method. For example, the output of the peak hold circuit 111 is AD converted and is calculated by a microprocessor, by which the time constant is obtained by using a program. The power theft then can be determined from that the obtained time constant is smaller than that in the absence of the power theft. Moreover, the power theft can be determined from a difference in the shape of the current change, by performing advanced signal processing.

The detection section is desirably set to be greater than or equal to "2Q/ω₀" if the resonant frequency of the power transmission antenna 13 is ω₀. Moreover, the power theft inspection is desirably performed, periodically, for example, at intervals of several minutes to several tens of minutes, or the like.

(Switch Control)

Next, switch control performed by the power theft detection unit 101 as configured above will be explained with reference to FIG. 5 to FIG. 8.

The power theft detection unit 101 has a switch control circuit 120 (refer to FIG. 5) incorporated therein, which is configured to control each of the switches SW1 and SW2 of the power transmitting apparatus 10 and the switch SW3 of the power receiving apparatus 20. The operation of the switch control circuit 120 will be specifically explained below. In the example, the purpose is to reduce an electrical load placed on each of the power transmitting apparatus 10 and the power receiving apparatus 20 as much as possible, upon opening the switches SW1 and SW3.

Figure 6:
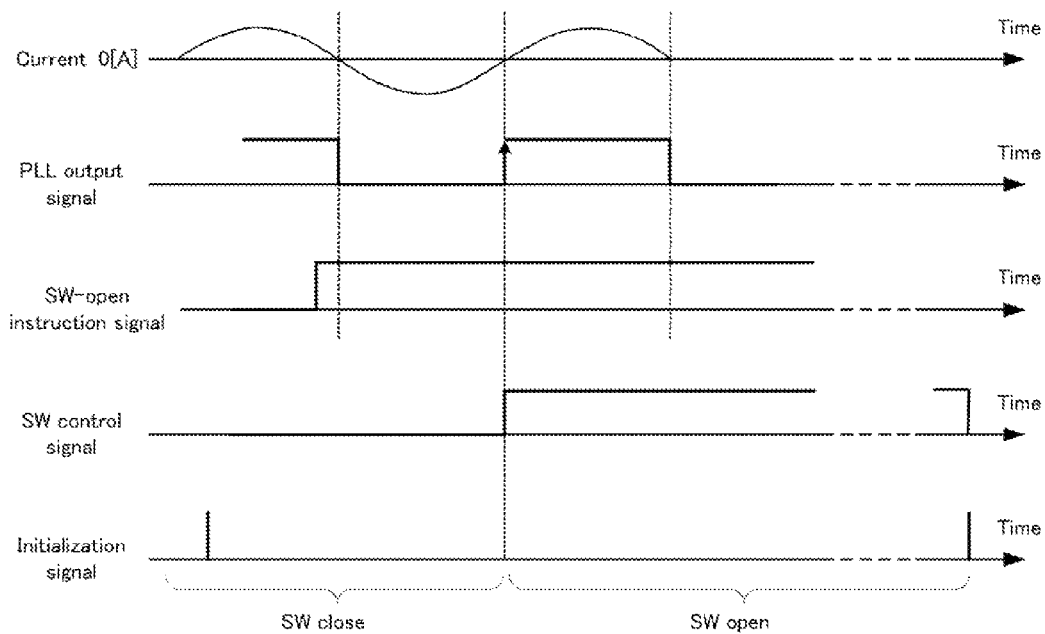
FIG. 6 is a diagram illustrating one example of input/output signals associated with the switch control circuit in the power theft detection unit in the example.

If the switch SW3 of the power receiving apparatus 20 is opened, a signal indicating a current detected by the current detector 24 of the power receiving apparatus 20 (refer to a graph at the top of FIG. 6) is binarized by a phase locked loop (PLL) (or a comparator) of the switch control circuit 120 (refer to a graph at the second top of FIG. 6). As illustrated in FIG. 6, an output signal of the PLL falls or rises at a time point at which the antenna current (or the current of the power reception antenna 23) becomes almost zero. Since the output signal of the PLL is a clock (CLK) signal, the switch SW3 can be opened at the Lime point at which the current of the power reception antenna 23 becomes almost zero, as illustrated at the fourth top of FIG. 6.

In the same manner, if the switch SW1 of the power transmitting apparatus 10 is opened, the signal indicating the current detected by the current detector 14 of the power transmitting apparatus 10 is binarized by the PLL of the switch control circuit 120. Since the output signal of the PLL is the clock signal, the switch SW1 can be opened at the time point at which the current of the power reception antenna 13 becomes almost zero.

In FIG. 6, a change point of the antenna current from minus to plus is set as a timing to open the switches SW1 and SW3, but a change point of the antenna current from plus to minus may be set as the timing to open the switches SW1 and SW3.

Figure 7:
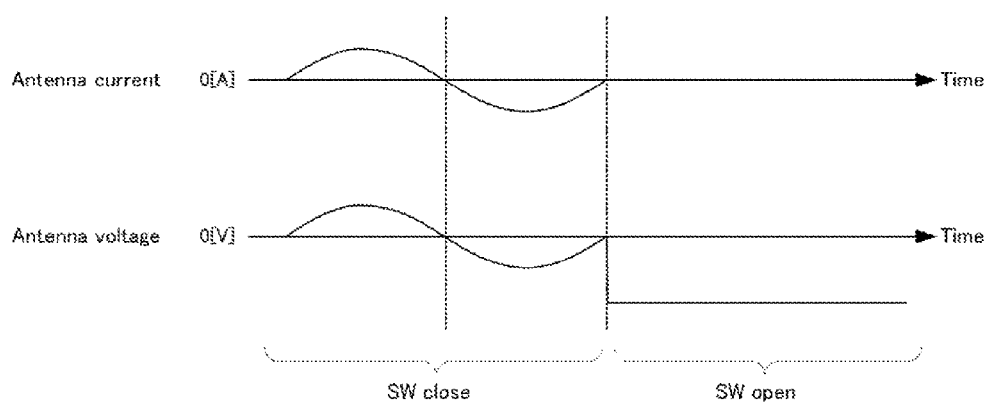
FIG. 7 is a diagram illustrating one example of a time variation of each of the current and voltage associated with the antenna upon opening switches.

As described above, it is possible to relatively suppress the change in the antenna current, as illustrated in FIG. 7, by opening the switches SW1 and SW3 at the timing at which the antenna current becomes almost zero. As a result, it is possible to open the switches SW1 and SW3 while suppressing the electrical load placed on each of the power transmitting apparatus 10 and the power receiving apparatus 20.

Figure 8:
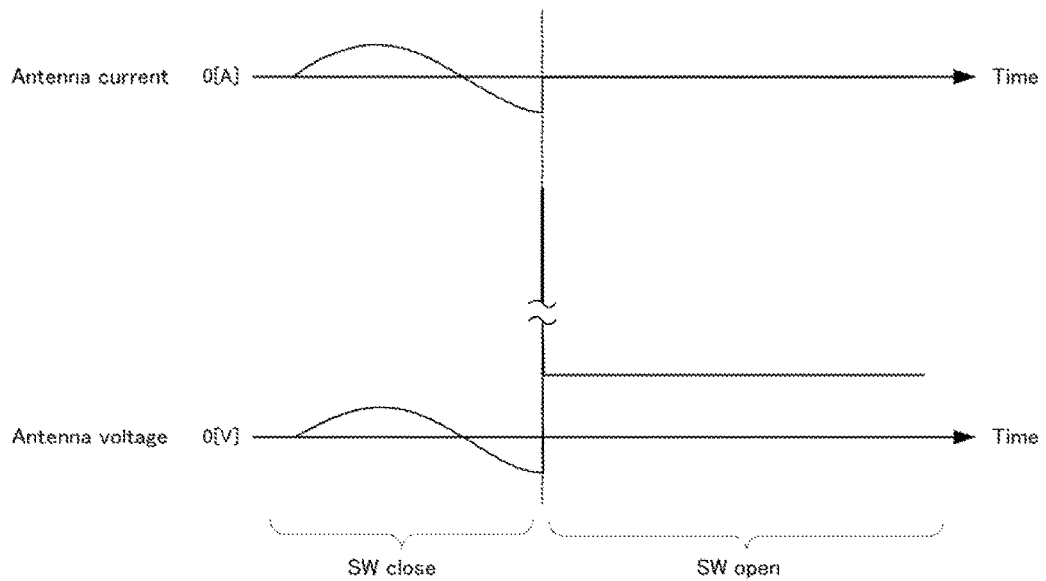
FIG. 8 is a diagram illustrating another example of the time variation of each of the current and voltage associated with the antenna upon opening the switches.

If the switch are opened without consideration of the antenna current, excessive voltage occurs when the switch are opened, for example, as illustrated in FIG. 8. Then, there is such a problem that Malfunction may occur in the power transmitting apparatus 10 and/or the power receiving apparatus 20 due to the opening of the switches.

The excessive voltage occurs due to an inductance component of the antenna. In other words, the antenna current suddenly becomes zero due to the opening of the switches, and thus, the antenna has the excessive voltage which is the product of a differential value of the current change and the inductance component. It is therefore necessary to reduce the current change as much as possible in order to reduce the excessive voltage.

Thus, in the example, as described above, the switches SW1 and SW3 are opened at the timing at which the antenna current becomes almost zero, and thus the aforementioned problem can be avoided.

The "power transmission antenna 13", the "AC power supply 11", the "current detector 14", the "power reception antenna 23", the "power reception control unit 22", the "current detector 24", the "power theft detection unit 101" and the "switch control circuit 120" in the example are one example of the "power transmission unit", the "power supply unit", the "first current detecting device", the "power reception unit", the "power reception control circuit", the "second current detecting device", the "determining device" and the "controlling device" of the present invention, respectively. The "switch SW1", the "switch SW2" and the "switch SW3" in the example are one example of the "first switch unit", the "second switch unit" and the "third switch unit" of present invention respectively.

Another Example

Figure 9:
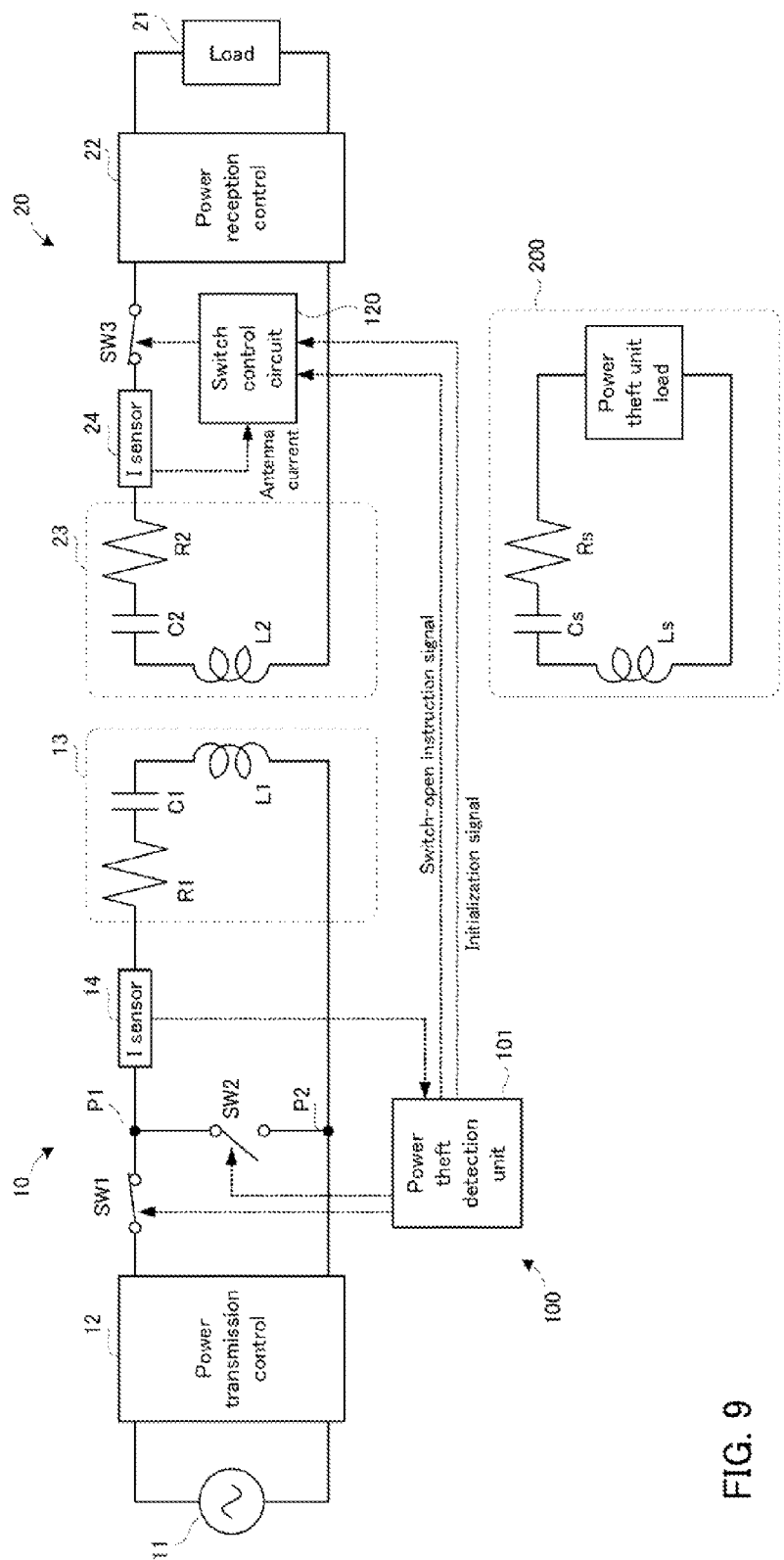
FIG. 9 is a conceptual diagram illustrating a schematic configuration of a wireless power transmission system in another example.

Another example of the power theft inspection apparatus of the present invention will be explained with reference to FIG. 9. FIG. 9 is a conceptual diagram illustrating a schematic configuration of a wireless power transmission system, to the same effect as in FIG. 1. Members common to those in the aforementioned example will carry the same reference numerals on the drawing. An explanation common to that in the aforementioned example will be omitted, as occasion demands.

In the example, the power theft inspection unit 101 is disposed on the power transmitting apparatus 10 side, and has a switch control circuit 120 (refer to FIG. 5) incorporated therein, which is configured to control each of the switches SW1 and SW2. On the other hand, the power receiving apparatus 20 is provided with a switch control circuit 120 for controlling the switch SW3 of the power receiving apparatus 20. In other words, the switch control circuit 120 for controlling the switch SW3 is not incorporated in the power theft inspection 101. A signal indicating the current detected by the current detector 24, a switch-open instruction signal and an initialization signal for the switch SW3 outputted from the power theft inspection unit 101 of the power transmitting apparatus 10 are inputted to the switch control circuit 120 for controlling the to switch SW3.

In the example, the control of the switch SW3 is performed as follows: namely, the signal indicating the current detected by the current detector 24 of the power receiving apparatus 20 is firstly binarized by a PLL circuit or a comparator of the switch control circuit 120 for controlling the switch SW3 (refer is to FIG. 6). Therefore, a PLL output signal is a clock (CLK) signal in which the PLL output signal falls or rises at a time point at which the antenna current of the power reception antenna 23 becomes almost zero. A timing at which the switch-open instruction signal outputted from the power theft detection unit 101 changes into an H level is unknown; however, the switch-open instruction signal changes into the H level at the timing at which the current of the power reception antenna 23 becomes almost zero by being latched by the clock signal. As a result, the switch SW3 is opened at the timing at which the current of the power reception antenna 23 becomes almost zero. An explanation of the control of the switches SW1 and SW2 is omitted because it is the same as in the aforementioned example.

The invention may be embodied in other specific forms without departing from the spirit or essential characteristics thereof. The present embodiments and examples are therefore to be considered in all respects as illustrative and not restrictive, the scope of the invention being indicated by the appended claims rather than by the foregoing description and all changes which come within the meaning and range of equivalency of the claims are therefore intended to be embraced therein.

DESCRIPTION OF REFERENCE NUMERALS AND LETTERS 10 power transmitting apparatus
11 alternating current power supply
12 power transmission control unit
13 power transmission antenna
14, 24 current detector
20 power receiving apparatus
21 load
22 power reception control unit
23 power reception antenna
100 power theft inspection apparatus
101 power theft detection unit
200 power theft apparatus
SW1, SW2, SW3 switch
P1, P2 terminal

What is claimed is:

1. A power theft inspection apparatus configured to detect presence or absence of power theft for a power transmitting apparatus provided with a power transmission unit having two terminals, a power supply unit configured to supply alternating current (AC) power to the power transmission unit, a first switch unit disposed between one of the two terminals and the power supply unit, a second switch unit which allows a short-circuit between the two terminals, and a first current detecting device configured to detect a current flowing through the power transmission unit, said power theft inspection apparatus comprising:

a controlling device configured to control the first switch unit such that the first switch unit is opened and then control the second switch unit such that the second switch unit is closed; and a determining device configured to determine whether or not there is the power theft according to the current detected by the first current detecting device, wherein said controlling device controls a third switch, which is disposed between a power reception control circuit and a power reception unit of a power receiving apparatus configured to receive electric power transmitted from the power transmitting apparatus, such that the third switch unit is opened, before controlling the first switch unit such that the first switch unit is opened.

2. The power theft inspection apparatus according to claim 1, wherein the power receiving apparatus further comprises a second current detecting device configured to detect a current flowing between the power reception unit and the power reception control circuit, and said controlling device
controls the third switch unit such that the third switch unit is opened at a timing at which the current detected by the second current detecting device can be considered to be zero, or controls the first switch unit such that the first switch unit is opened at a timing at which the current detected by the first current detecting device can be considered to be zero.

3. The power theft inspection apparatus according to claim 1, wherein said controlling device controls the first switch unit such that the first switch unit is opened at a timing at which the current detected by the first current detecting device can be considered to be zero.

4. The power theft inspection apparatus according to claim 1, wherein said controlling device controls the second switch unit such that the second switch unit is opened at an end of a power theft inspection, then controls the third switch unit such that the third switch unit is closed, and then controls the first switch such that the first switch unit is closed.

5. The power theft inspection apparatus according to claim 1, wherein said determining device determines whether or not there is the power theft on the basis of a time constant of decay associated with the current detected by the first current detecting device in a predetermined period after the closing of the second switch unit.

6. The power theft inspection apparatus according to claim 1, wherein said controlling device controls the power supply unit to reduce the AC power supplied to the power transmission unit before controlling the first switch unit such that the first switch unit is opened.

7. The power theft inspection apparatus according to claim 2, wherein
the power receiving apparatus comprises a switch controlling circuit configured to control the third switch unit by inputting a signal indicating current detected by the second current detecting device and a switch-open instruction signal created by the controlling device, and
said controlling device controls the third switch unit through the switch controlling circuit.

8. A power theft inspection method performed by a power theft inspection apparatus configured to detect presence or absence of power theft for a power transmitting apparatus that has a power transmission unit having two terminals, a power supply unit configured to supply alternating current (AC) power to the power transmission unit, a first switch unit disposed between one of the two terminals and the power supply unit, a second switch unit which allows a short-circuit between the two terminals, and a first current detecting device configured to detect a current flowing through the power transmission unit, said power theft inspection method comprising:
a first process of controlling a third switch, which is disposed between a power reception control circuit and a power reception unit of a power receiving apparatus configured to receive electric power transmitted from the power transmitting apparatus, such that the third switch unit is opened upon a power theft inspection;
a second process of controlling the first switch unit such that the first switch unit is opened after the first process;
a third process of controlling the second switch unit such that the second switch unit is closed after the second process; and
a fourth process of determining whether or not there is the power theft according to the current detected by the first current detecting device after the third process.

9. A non-transitory tangible recording medium configured to store therein a computer program that, upon execution by a computer mounted on a power theft inspection apparatus, causes the power theft inspection apparatus to function as a controlling device and a determining device, said power theft inspection apparatus being configured to detect a presence or absence of power theft for a power transmitting apparatus that has a power transmission unit having two terminals, a power supply unit configured to supply alternating current (AC) power to the power transmission unit, a first switch unit disposed between one of the two terminals and the power supply unit, a second switch unit which allows a short-circuit between the two terminals, and a first current detecting device configured to detect a current flowing through the power transmission unit, said power theft inspection apparatus comprising:
the controlling device configured to control the first switch unit such that the first switch unit is opened and then control the second switch unit such that the second switch unit is closed; and
the determining device configured to determine whether or not there is the power theft according to the current detected by the first current detecting device,
wherein said controlling device controls a third switch, which is disposed between a power reception control circuit and a power reception unit of a power receiving apparatus configured to receive electric power transmitted from the power transmitting apparatus, such that the third switch unit is opened, before controlling the first switch unit such that the first switch unit is opened.

* * * * *